(12) United States Patent
Chen et al.

(10) Patent No.: US 7,528,483 B2
(45) Date of Patent: *May 5, 2009

(54) COOLING SYSTEM FOR A SEMICONDUCTOR DEVICE AND METHOD OF FABRICATING SAME

(75) Inventors: Howard Hao Chen, Yorktown Heights, NY (US); Louis L. Hsu, Fishkill, NY (US); Joseph F. Shepard, Jr., Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

This patent is subject to a terminal disclaimer.

(21) Appl. No.: 11/558,032

(22) Filed: Nov. 9, 2006

(65) Prior Publication Data

US 2007/0064395 A1 Mar. 22, 2007

Related U.S. Application Data

(60) Continuation of application No. 11/317,298, filed on Dec. 23, 2005, now Pat. No. 7,170,164, which is a division of application No. 10/661,299, filed on Sep. 12, 2003, now Pat. No. 7,029,951.

(51) Int. Cl.
*H01L 23/12* (2006.01)

(52) U.S. Cl. .................... 257/712; 257/714; 257/720; 257/E23.097; 257/E23.098

(58) Field of Classification Search ................ 257/666, 257/675, 678, 701, 706, 712, 714, 717, 720, 257/721, 782, 796, E23.088, E23.097, E23.098, 257/E23.101, E23.103, 625, 787, 23.051, 257/E23.099
See application file for complete search history.

(56) References Cited

U.S. PATENT DOCUMENTS

| | | | |
|---|---|---|---|
| 6,528,878 B1 * | 3/2003 | Daikoku et al. | 257/714 |
| 6,607,928 B1 * | 8/2003 | Eiles et al. | 438/16 |
| 7,170,164 B2 * | 1/2007 | Chen et al. | 257/712 |

\* cited by examiner

*Primary Examiner*—Brook Kebede
(74) *Attorney, Agent, or Firm*—F. Chau & Associates, LLC (57) ABSTRACT

A cooling system for a semiconductor substrate includes a plurality of trenches formed from a backside of the semiconductor substrate, and thermally conductive material deposited in the plurality of trenches. A method of forming cooling elements in a semiconductor substrate, includes coating a backside of the semiconductor substrate with a first mask layer, forming a plurality of trench patterns in the first mask layer, etching the semiconductor substrate to form a plurality of trenches along the plurality of trench patterns, and depositing thermally conductive material in the plurality of trenches. Trenches constructed from the backside of a wafer improve efficiency of heat transfer from a front-side to the backside of an integrated-circuit chip. The fabrication of trenches from the backside of the wafer allows for increases in the depth and number of trenches, and provides a means to attach passive and active cooling devices directly to the backside of a wafer.

12 Claims, 10 Drawing Sheets

COOLING SYSTEM FOR A SEMICONDUCTOR DEVICE AND METHOD OF FABRICATING SAME

CROSS-REFERENCE TO RELATED APPLICATIONS

This application is a Continuation of U.S. application Ser. No. 11/317,298, filed on Dec. 23, 2005 now U.S. Pat. No. 7,170,164, which is a Divisional of U.S. application Ser. No. 10/661,299, filed on Sep. 12, 2003 now U.S. Pat. No. 7,029,951, the disclosures of which are incorporated by reference herein in its entirety.

BACKGROUND OF THE INVENTION

1. Field of the Invention

The present invention relates to a cooling system for a semiconductor device and a method of fabricating same and, more particularly, to a cooling system including backside trenches and a method of fabricating same.

2. Description of the Related Art

The advent of nanotechnology has resulted in an exponential growth of integrated circuit density, The increasingly dense integrated circuits generate more thermal heat than past circuits. However, many known passive or active semiconductor cooling systems are incapable of adequately dissipating excessive amounts of thermal heat.

In addition, the increase of wafer thickness due, in part, to the use of an extra oxide layer as a result of silicon-on-insulator (SOI) technology, will require more sophisticated cooling systems, In order to compensate for additional thermal resistance on the backside of the wafer, these cooling systems can be placed as close to the chip as possible, Embedded cooling devices on integrated-circuit chips are known. See, e.g., U.S. Pat. No. 5,313,094 to Beyer et al. Some of the known embedded cooling devices provide heat dissipation by etching a trench or hole through an active silicon region and an underlying dielectric layer to a supportive silicon substrate, oxidizing a trench wall, and filling the trench with a material having high thermal-conductivity, such as CVD diamond.

Integrated-circuit chips with full trench dielectric isolation of each portion of the chip are also known. See, e.g., U.S. Pat. Nos. 5,753,529, 5,757,081 and 5,767,578 to Chang et al. After etching trenches in a substrate and filling the trenches with dielectric material, a heat sink cap is attached to a passivation layer on the front side of the substrate. The passivation layer can be made of conventional material such as plasma nitride or a CVD diamond film that provides both electrical insulation and thermal conductivity.

Trenches formed from the top of a bonded SOI wafer through an isolation layer to a base layer are also known. See, e.g., U.S. Pat. No. 6,080,608 to Nowak. A conductive pillar in a trench may be formed of doped polysilicon, which provides a heat sink that is physically in contact with, but electrically insulated from, the base of the SOI wafer.

Known methods of forming conventional cooling devices in integrated circuits require that deep trenches be etched, in the final steps of the manufacturing process, from the front side of a wafer, through metal interconnect and device levels, to the bottom of the wafer. The trenches are filled with thermally conductive material to help dissipate the heat generated by the chip. The etching of deep trenches from the front side of the wafer, however, has a number of drawbacks. For example, front-side trench etching results in increased chip area and reduced circuit density. In order to position thermal trenches in an area that generates the most thermal power, existing circuits must be moved to a less congested area and die size needs to be increased. Another problem with front-side trench etching is that the trench must be relatively small due to the area constraints and deep enough to extend from the front side to the backside of a chip. As a result, the processing of small and deep trenches is time consuming and expensive.

Front-side trench etching also can degrade device reliability. Due to the close proximity of trenches to semiconductor devices on a chip, undesirable crystalline defects, such as dislocations, may result from mechanical stress caused during the fabrication of a trench. Further, front-side trench etching may compromise the quality of a metal interconnect. The etching of deep trenches through metal interconnect levels may force some metal wires to change their routing path and may reduce the density of the metal interconnects.

Therefore, there exists a need for a different approach to trench construction which eliminates the problems that arise from front-side trench etching.

BRIEF SUMMARY OF THE INVENTION

A method of forming cooling elements in a semiconductor substrate, in accordance with the present invention, includes coating a backside of the semiconductor substrate with a first mask layer, forming a plurality of trench patterns in the first mask layer, etching the semiconductor substrate to form a plurality of trenches along the plurality of trench patterns, and depositing thermally conductive material in the plurality of trenches.

In alternate embodiments, the method may include forming a first diffusion layer in the semiconductor substrate, forming a second diffusion layer in the first diffusion layer, and doping the second diffusion layer with a dopant having a polarity opposite a polarity of the semiconductor substrate. The method may also include stopping the etching of the semiconductor substrate when the dopant contained in the second diffusion layer is detected in a product of the etching. The first mask layer may be a photoresist, the trench patterns may be formed by one of optical, x-ray, extreme ultra-violet, electron beam and ion beam lithographic techniques, and the plurality of trenches may be formed in the vertical direction. Etching of the semiconductor substrate may be performed with $Cl_2$-based plasma and depositing the thermally conductive material may be performed by one of chemical vapor deposition, atomic layer deposition, physical vapor deposition and electroplating. The thermally conductive material may be made from one of aluminum nitride, aluminum, copper-tungsten, silicon carbides gold, copper, diamond and silver, The semiconductor substrate may be one of a complimentary metal oxide semiconductor wafer and a silicon-on-insulator wafer. The plurality of trenches may be formed in an intergrated-circuit chip of the semiconductor substrate, may be formed away from at least one of a passivation layer, an interconnect layer, a device layer and a doped well structure of the semiconductor substrate, and may be formed one of before and after processing of remaining portions of the semiconductor substrate. The method may further include integrating an external heat sink or an active cooling apparatus on the backside of the semiconductor substrate. Integrating the active cooling apparatus on the backside of the semiconductor substrate may include coating the backside of the semiconductor substrate with a second mask layer, patterning the second mask layer, etching a continuous trench into the backside of the semiconductor substrate, forming at least one opening in the continuous trench for allowing coolant supplied from the active cooling apparatus to one of exit and enter the continuous trench, and positioning the active cooling apparatus on the backside of the semiconductor substrate, The active cooling apparatus may be one of a thermal electric cooling component, a micro-fan device and a micropump, and may be one of directly fabricated on the backside of the semiconductor substrate and separately built and mounted on the backside of the semiconductor substrate.

A method of forming an active cooling apparatus on a semiconductor substrate, in accordance with the present invention, includes coating the backside of a first semiconductor substrate with a mask layer, patterning the mask layer, etching a first continuous trench into the backside of the first semiconductor substrate, forming at least one opening in the first continuous trench for allowing coolant supplied from the active cooling apparatus to one of exit and enter the first continuous trench, and positioning the active cooling apparatus on the backside of the first semiconductor substrate.

In alternate embodiments, the active cooling apparatus may be one of a thermal electric cooling component, a micro-fan device and a micropump, and may be one of directly fabricated on the backside of the first semiconductor substrate and separately built and mounted on the backside of the first semiconductor substrate. The method of forming an active cooling apparatus on a semiconductor substrate may further include forming a second semiconductor substrate including a second continuous trench, and fastening the second semiconductor substrate to the first semiconductor substrate at a position between the backside of the first semiconductor substrate and the active cooling apparatus, whereby the active cooling apparatus rests on the second semiconductor substrate. The second continuous trench may be a mirror image of the first continuous trench of the first substrate and the step of fastening may include one of anodic bonding and metallurgical soldering. The second semiconductor substrate may include at least one opening in the second continuous trench for allowing the coolant supplied from the active cooling apparatus to one of exit and enter the second continuous trench, The mask layer may be a photoresist and the first continuous trench may be formed in the horizontal direction. The first semiconductor substrate may be one of a complimentary metal oxide semiconductor wafer and a silicon-on-insulator wafer and the second semiconductor substrate may be one of a silicon substrate and a plate-glass substrate. The first continuous trench may be formed in an intergrated-circuit chip of the first semiconductor substrate.

A cooling system for a semiconductor substrate, in accordance with the present invention, includes a plurality of trenches formed from a backside of the semiconductor substrate, and thermally conductive material deposited in the plurality of trenches.

In alternate embodiments, the cooling system may further include a first diffusion layer formed in the semiconductor substrate, and a second diffusion layer formed in the first diffusion layer, wherein the second diffusion layer is doped with a dopant having a polarity opposite a polarity of the semiconductor substrate. The depth of the plurality of trenches may end at the second diffusion layer. The plurality of trenches may be one of cylindrical, oval, square, triangular, S-shaped, T-shaped and U-shaped, and may be formed in the vertical direction by etching the semiconductor substrate with $Cl_2$-based plasma, from the backside of the semiconductor substrate, down to the second diffusion layer. Deposition of the thermally conductive material may be performed by one of chemical vapor deposition, atomic layer deposition, physical vapor deposition and electroplating and the thermally conductive material may be made from one of aluminum nitride, aluminum, copper-tungsten, silicon carbide, gold, copper, diamond and silver. The semiconductor substrate may be one of a complimentary metal oxide semiconductor wafer and a silicon-on-insulator wafer. The plurality of trenches may be formed in an intergrated-circuit chip of the semiconductor substrate, may be formed away from at least one of a passivation layer, an interconnect layer, a device layer and a doped well structure of the semiconductor substrate, and may be formed one of before and after processing of remaining portions of the semiconductor substrate. The cooling system may further include an external heat sink or an active cooling apparatus on the backside of the semiconductor substrate, The active cooling apparatus may be connected to a continuous trench formed in the backside of the semiconductor substrate, and to at least one opening in the continuous trench for allowing coolant to enter the continuous trench from the active cooling apparatus, The active cooling apparatus may be one of a thermal electric cooling component, a micro-fan device and a micropump and may be one of directly fabricated on the backside of the semiconductor substrate and separately built and mounted on the backside of the semiconductor substrate.

A cooling system for a semiconductor device, in accordance with the present invention, includes an active cooling apparatus positioned on the backside of a first semiconductor substrate, a first continuous trench formed in the backside of the first semiconductor substrate, and at least one opening in the first continuous trench for allowing coolant supplied from the active cooling apparatus to one of exit and enter the first continuous trench.

The active cooling apparatus may be one of a thermal electric cooling component, a micro-fan device and a micropump and may be one of directly fabricated on the backside of the semiconductor substrate and separately built and mounted on the backside of the semiconductor substrate. The cooling system may further include a second semiconductor substrate including a second continuous trench wherein the second semiconductor substrate is fastened to the first semiconductor substrate at a position between the backside of the first semiconductor substrate and the active cooling apparatus, whereby the active cooling apparatus rests on the second semiconductor substrate, The second continuous trench may be a mirror image of the first continuous trench of the first substrate. The second semiconductor substrate may be fastened to the first semiconductor substrate by one of anodic bonding and metallurgical soldering and may include at least one opening in the second continuous trench for allowing the coolant supplied from the active cooling apparatus to one of exit and enter the second continuous trench. The first continuous trench may be formed in the horizontal direction. The first semiconductor substrate may be one of a complimentary metal oxide semiconductor wafer and a silicon-on-insulator wafer and the second semiconductor substrate may be one of a silicon substrate and a plate-glass substrate. The first continuous trench may be formed in an intergrated-circuit chip of the first semiconductor substrate.

Another method of forming cooling elements in a semiconductor substrate, in accordance with the present invention, includes etching the semiconductor substrate from a backside of the semiconductor substrate to form a plurality of trenches and depositing thermally conductive material in the plurality of trenches.

BRIEF DESCRIPTION OF THE DRAWINGS

Preferred embodiments of the invention can be understood in more detail from the following descriptions taken in conjunct on with the accompanying drawings in which.

DETAILED DESCRIPTION OF THE PREFERRED EMBODIMENTS

Preferred embodiments of the present invention will be described below in more detail with reference to the accompanying drawings. This invention may, however, be embodied in different forms and should not be construed as limited to the embodiments set forth herein. Rather, these embodiments are provided so that this disclosure will be thorough and complete, and will fully convey the scope of the invention to those skilled in the art.

The present invention relates to the construction of thermal trenches from the backside of a wafer to improve efficiency of heat transfer from a front-side to the backside of an integrated-circuit chip. In addition, the fabrication of deep trenches from the backside of the wafer increases the depth of the trench and the number of trenches that can be constructed, and provides a means to attach heat sinks directly to the backside of the chip.

Referring now to the drawings, FIGS. 1-5 show a method of fabricating backside deep trenches on a semiconductor substrate, according to an embodiment of the present invention.

Figure 1:
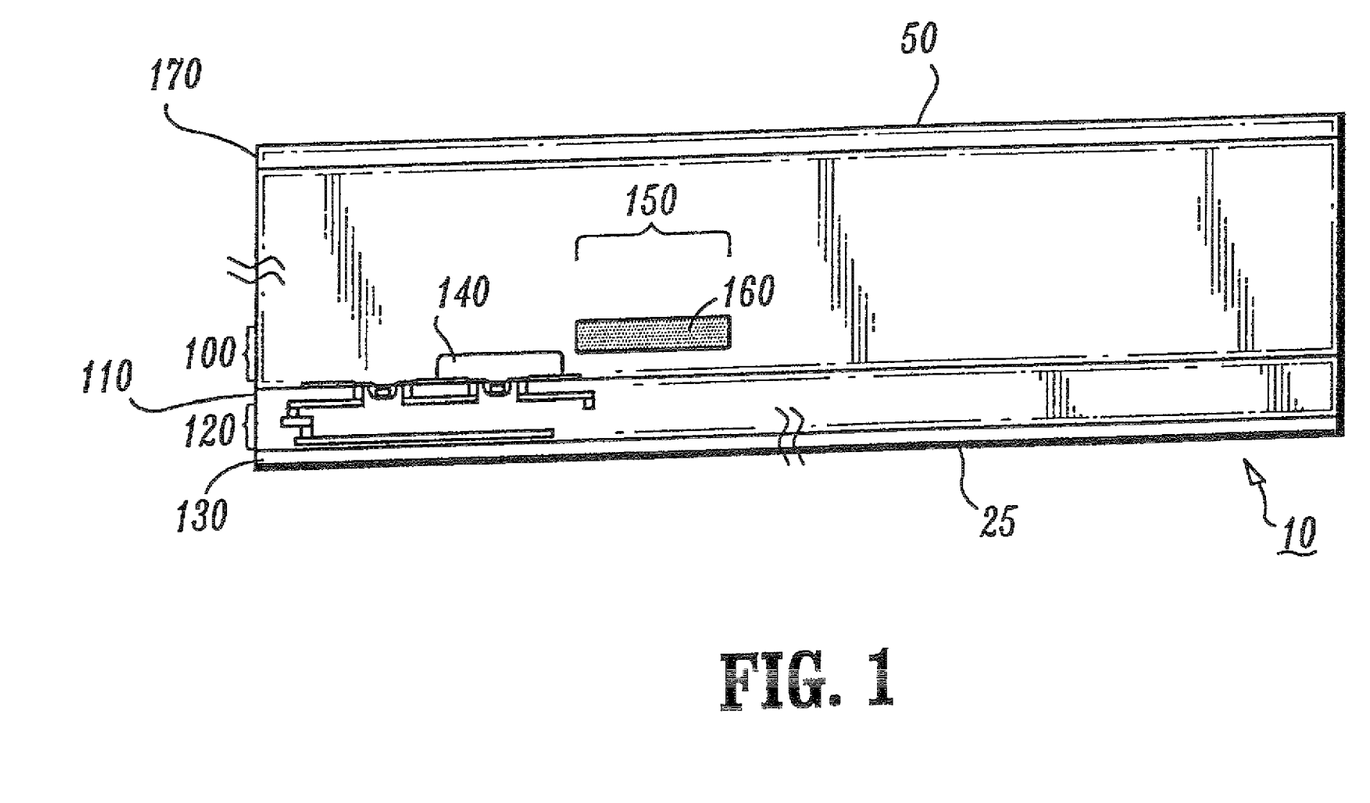
FIGS. 1-5 show a method of fabricating backside deep trenches on a semiconductor substrate, according to an embodiment of the present invention.

A semiconductor substrate or wafer 10, for example, made from silicon, comprises a front side 25 and a backside 50. As shown in FIG. 1, the substrate 10 is in a flipped position, whereby the backside 50 is located on top on the front side 25 is on the bottom. The structure of the semiconductor substrate 10 consists of a device layer 110 formed on diffusion layer 100. The device layer 110 may include polysilicon and gate oxide that from transistors. The diffusion layer 100 is preferably formed by a well-controlled doping process. Interconnect layers 120 are formed on the diffusion layer 100 including the device layer 110 and a passivation layer 130 is formed on the interconnect layers 120. The interconnect layers 120 and the passivation layer 130 are preferably formed from copper and silicon nitride, respectively. A doped well structure 140 and buried diffusion layer 160 are formed in the diffusion layer 100. The doped well structure 140 may be formed from n-well diffusion in a p-substrate or p-well diffusion in an n-substrate. The buried diffusion layer 160 may be formed by ion implantation. An etch stop region 150 is the area in which the depth of deep trench etching is controlled, and includes the buried diffusion layer 160. The etch stop region 150 consists of a buried layer of etch-stop material under the silicon substrate 10. The etch-stop material may be any material known in the art that has different etch characteristics from the material being etched in order to stop the etching process. Doping of the buried diffusion layer 160 is performed so that the dopants of the buried diffusion layer 160 have a polarity that is opposite the polarity of the bulk silicon substrate 10. The dopant may be, for example, boron, germanium or phosphorous.

Figure 2:
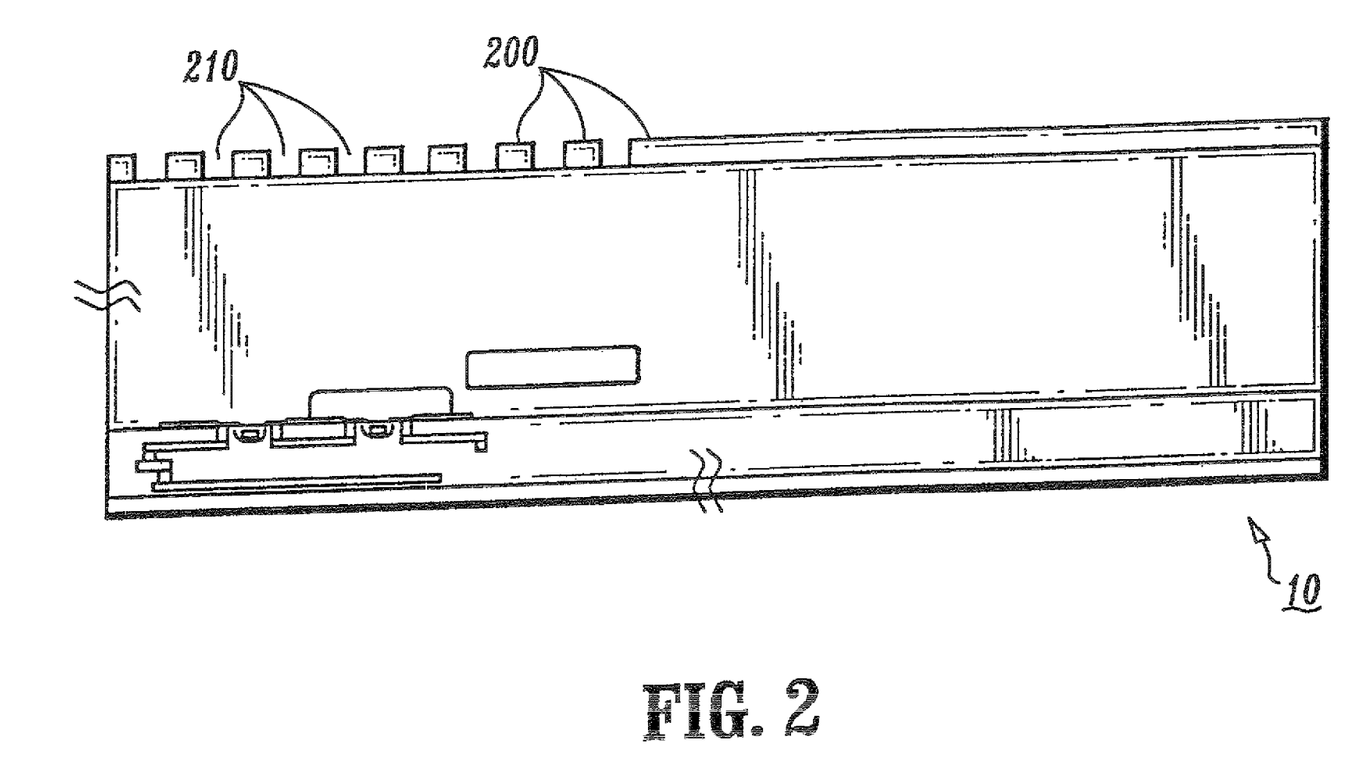

In the flipped position, the wafer 10 is coated with a mask layer 170, such as a photoresist. As shown in FIG. 2, photoresist patterns 200 and trench patterns 210 are then developed on the backside 50 of the wafer 10 by lithographic processes known in the art: such as, for example, optical and electron beam lithography.

Figure 3:
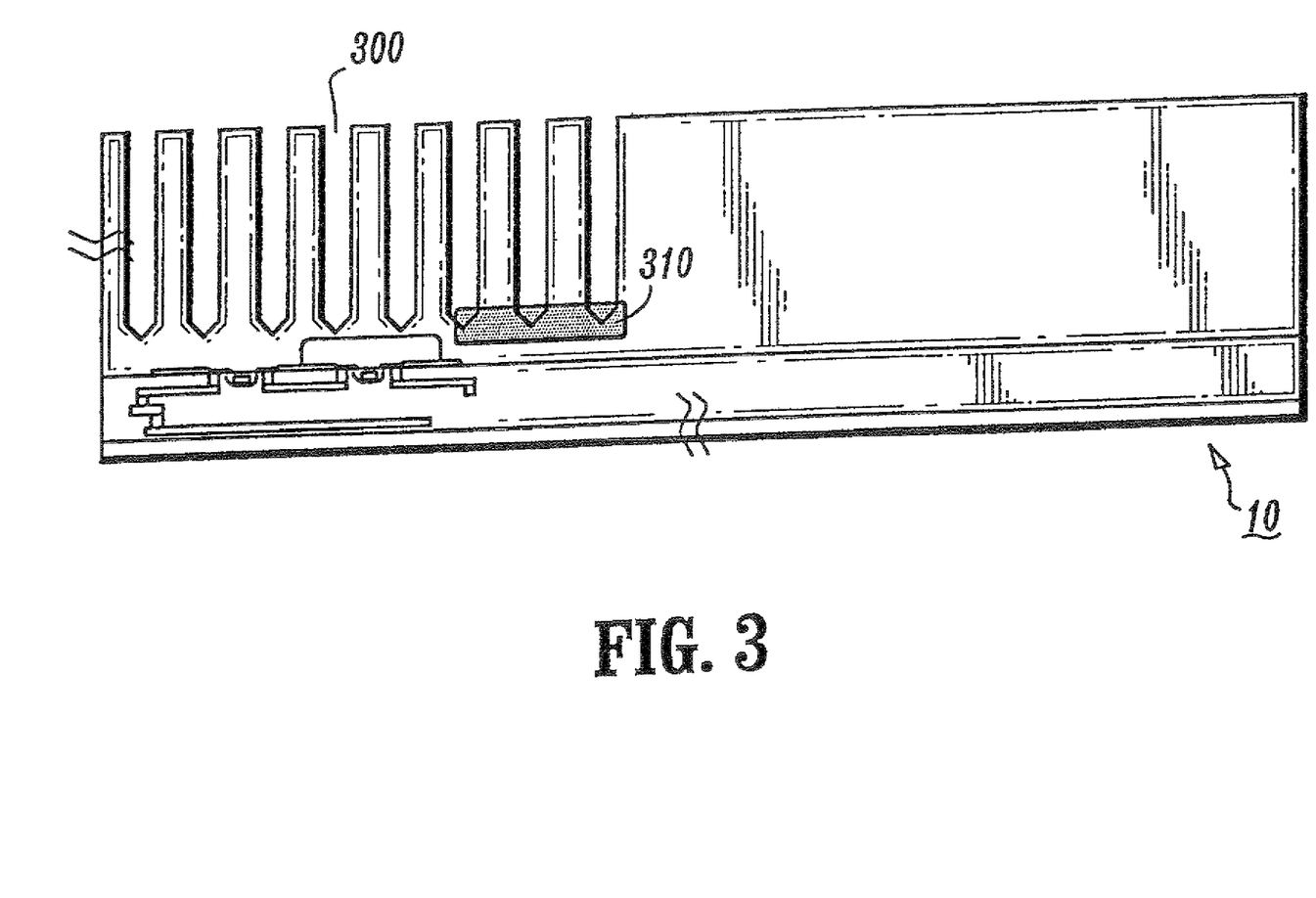

Referring to FIG. 3, vertical trenches 300 are formed by using reactive ions in $Cl_2$-based plasma to etch silicon with a high selectivity with respect to the mask 170. To properly control the depth of the trenches 300, the etching is stopped when the dopant contained in the etch stop layer 310 (i.e. buried diffusion layer 160) is detected in the product gases of the etch. The etch stop region 150 is reserved for limited penetration beyond the etch-stop layer 160. The etch stop layer 310 can be made of a buried implanted layer in a bulk CMOS substrate, or a buried oxide layer in an SOI wafer. Depending on the thickness of the buried layer, the etching of deep trenches can be partially or completely stopped at the buried layer.

Further, the trenches 300 must be etched with the appropriate aspect ratio to reduce the cost of drilling and filling these trenches 300 with thermally conductive material 420. The width of the trenches 300 are controlled by the trench patterns 210.

Figure 4:
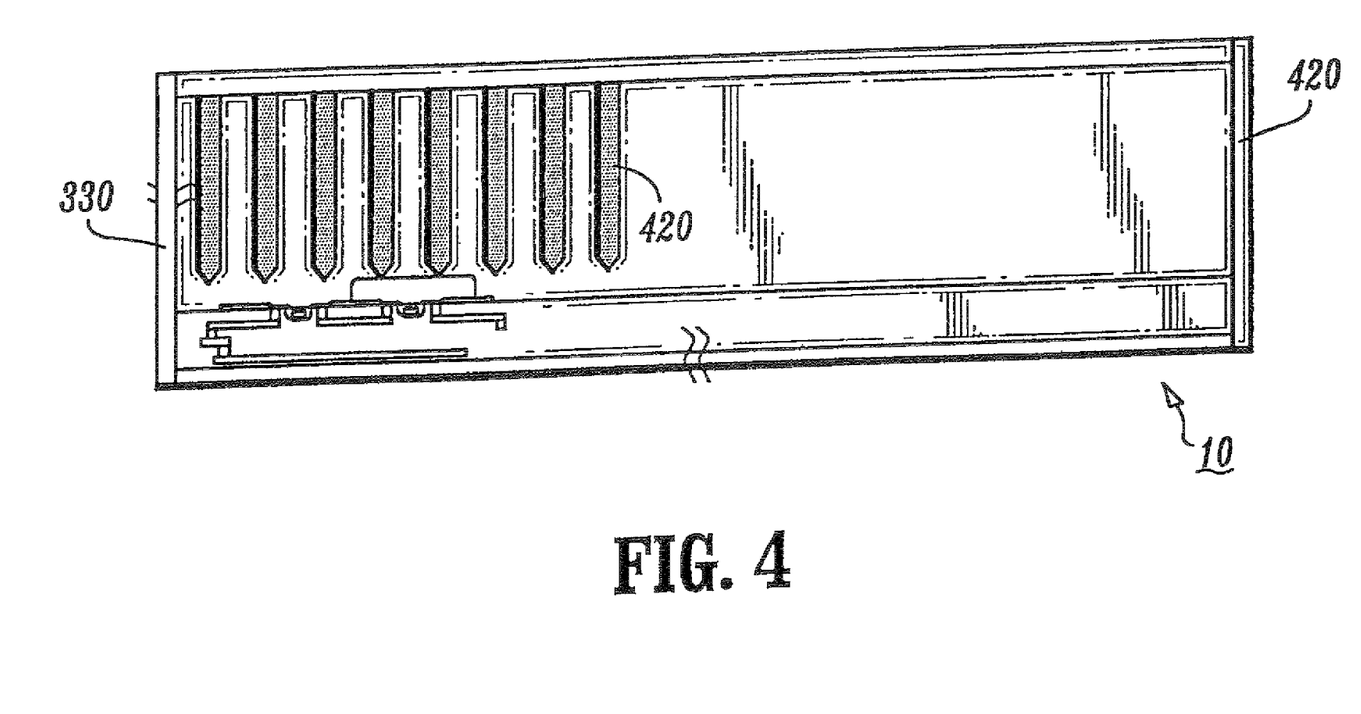

As shown in FIG. 4 the trenches 300 are filled and the sidewalls 330 of the wafer are coated with a material 420 that has a thermal conductivity greater than the silicon substrate. The material 420, may be, for example, aluminum nitride (AlN), aluminum, copper-tungsten (Cu—W with 20% Cu), silicon carbide (SiC), gold, copper, diamond or silver. See Table 1.

TABLE 1

| Fill-in materials and their thermal conductivities | |
|---|---|
| Fill-in Material | Thermal Conductivity (W/m K) |
| Silicon substrate | 150 |
| Aluminum nitride | 230 |
| Aluminum | 240 |
| Copper-tungsten (20% Cu) | 250 |
| Silicon carbide | 270 |
| Gold | 297 |
| Copper | 393 |
| Diamond | 400 |
| Silver | 418 |

A number of deposition techniques, such as chemical vapor deposition (CVD), atomic layer deposition (ALD), physical vapor deposition (PVD), and electroplating, can be used to deposit material 420 conformally in the trench structures 300. The trenches 300 can be formed at the backside 50 of the wafer 10 either before or after processing the remaining portions of the wafer.

Figure 5:
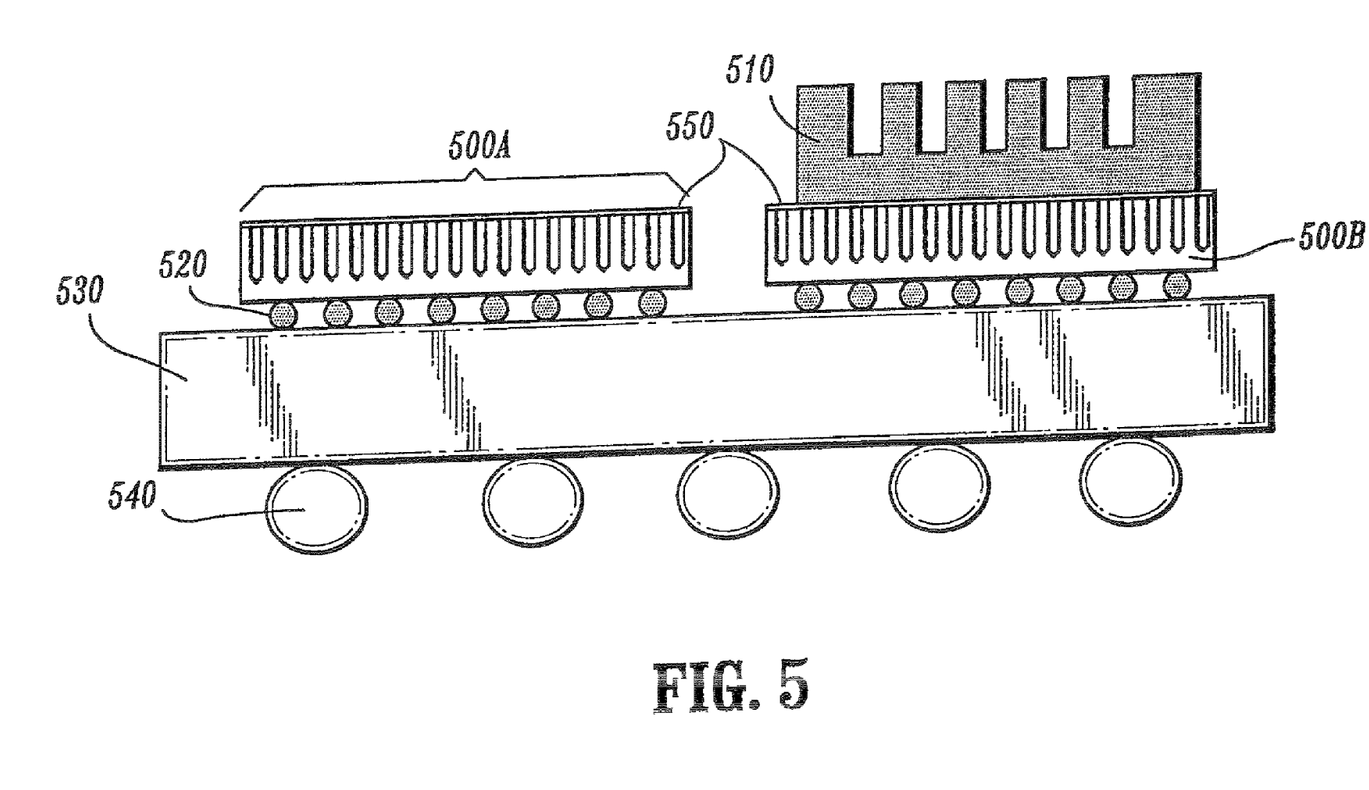

FIG. 5 shows the final assembly of two chips 500A and 500B on a flip-chip package 530. Each chip 500A and 500B includes trenches 300 filled with fill-in material 420 making up a backside on-chip cooling system. Controlled-collapse chip connection (C4) bumps 520 are used to connect chips 500A, 500B to the package 530 and ball-grid array (BGA) balls 540 are used to connect the package 530 to a printed circuit board. Conventional passive or active heat-removing devices, such as thermal-electric cooling devices and micro-fans, can be integrated on the backside 550 of each chip 500A, 500B. Chip 500B has a higher power density than chip 500A and requires an external heat sink 510 on the backside 550 thereof.

Figure 6:
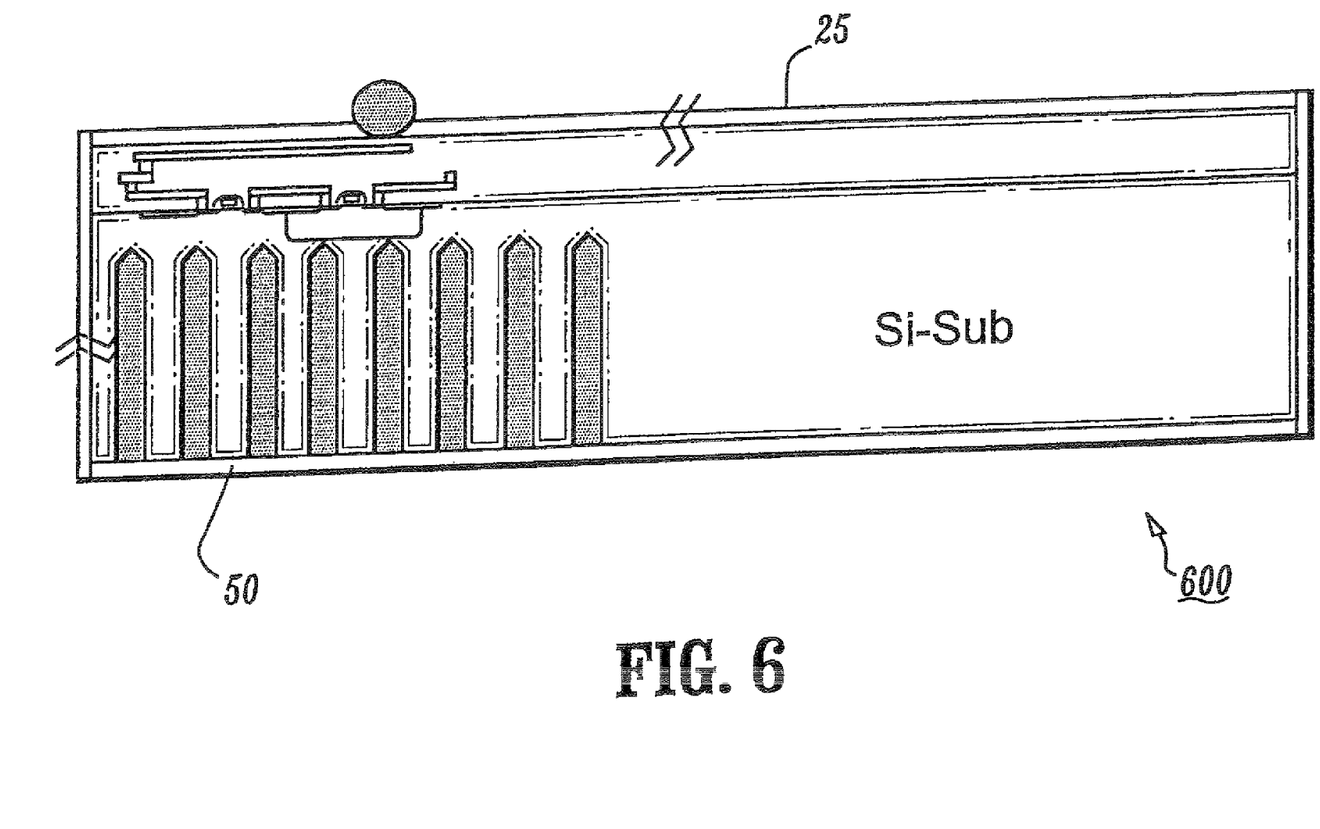
FIG. 6 shows a backside trench structure on a complimentary metal oxide semiconductor (CMOS) substrate according to an embodiment of the present invention.
Figure 7:
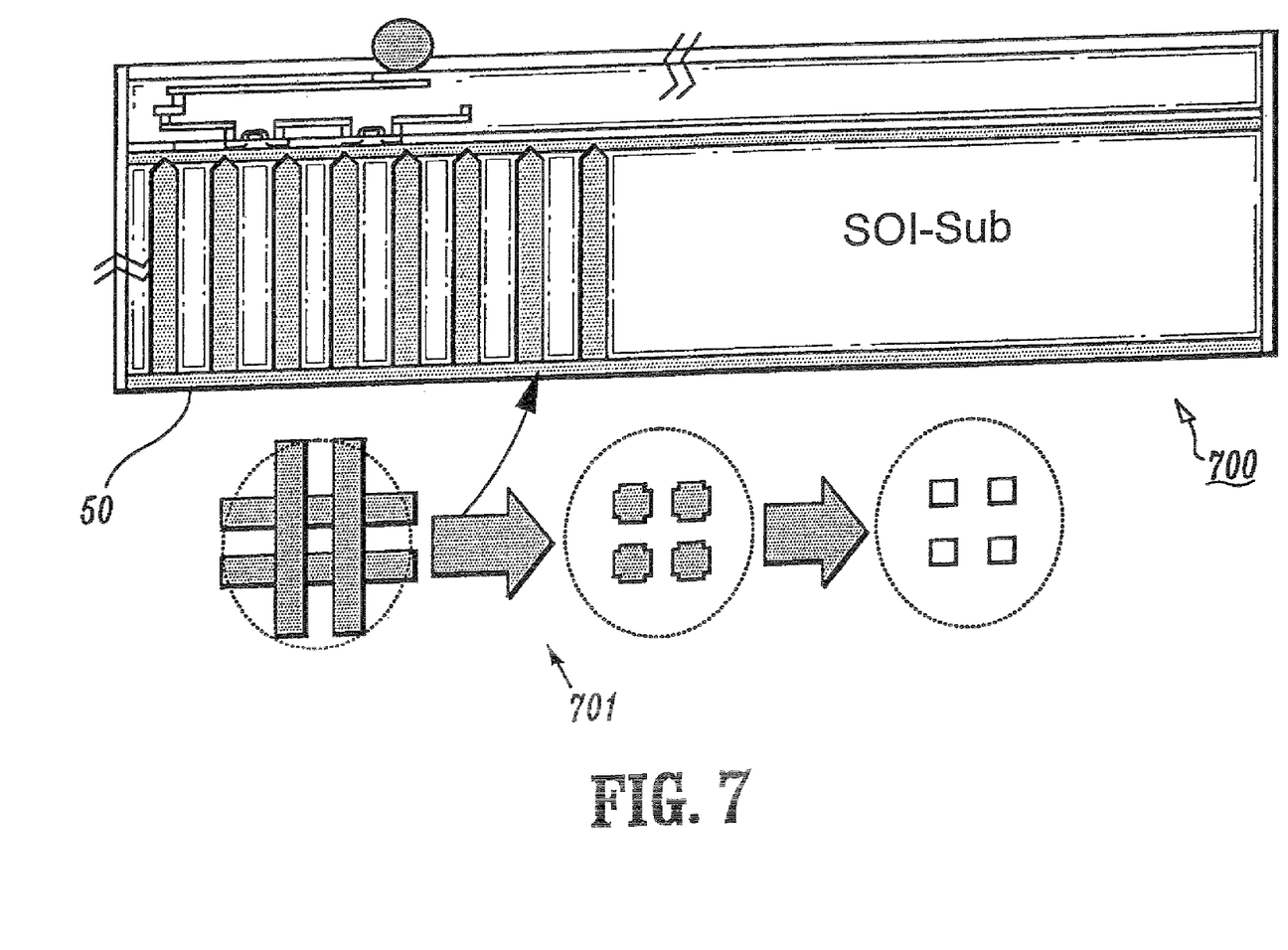
FIG. 7 shows a backside trench structure on a silicon-on-insulator (SOI) substrate according to an embodiment of the present invention.

As shown in FIGS. 6 and 7, the backside trench structure described above can be fabricated on both a bulk CMOS substrate 600 and an SOI substrate 700. FIG. 6 shows the backside cooling structure of an integrated-circuit chip built on the bulk CMOS wafer 600, and FIG. 7 shows the backside cooling structure of an integrated-circuit chip built on the SOI wafer 700. FIG. 7 also includes three lithographical patterns 701 illustrating some of the possible shapes of the trenches as seen from the backside 50 of the wafer 700. For example, the backside trenches formed in a substrate may be one of cylindrical, oval, square, triangular, S-shaped, T-shaped and U-shaped.

The etching of deep trenches from the backside of a wafer not only allows for the use of traditional heat sinks as passive cooling devices, but also allows for the use of active cooling devices, such as thermal electric cooling components, micro-fan devices. micropumps and other microelectromechanical systems (MEMS). The active cooling devices can be directly fabricated on the backside of a wafer, or separately built and mounted on the backside of the wafer.

After the backside trenches are fabricated, active cooling components such as micropumps, which pump gas or liquid coolant through a substrate, can be integrated on the backside of the silicon substrate. When the active cooling device is completely assembled, gas or liquid coolant can be pumped through cooling channels to optimize the heat transfer away from the bulk silicon. The cooling channels consist of a continuous trench structure etched into a substrate from the backside. The cooling channels are distinct from the vertical backside trenches by conducting heat in the horizontal direction.

Figure 8:
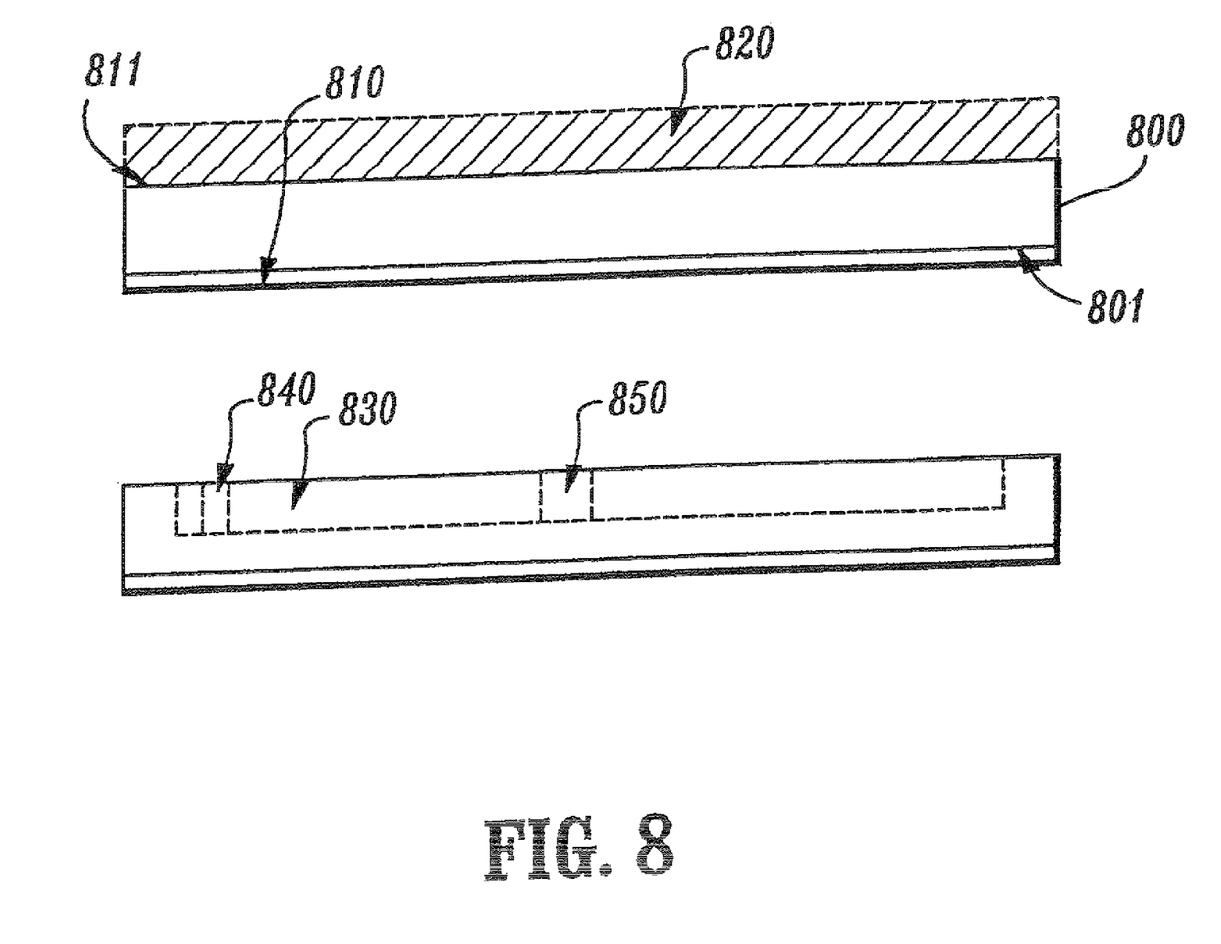
FIG. 8 shows a method of backside etching of a continuous trench on a first silicon substrate for active cooling, according to an embodiment of the present invention.
Figures 9A, 9B:
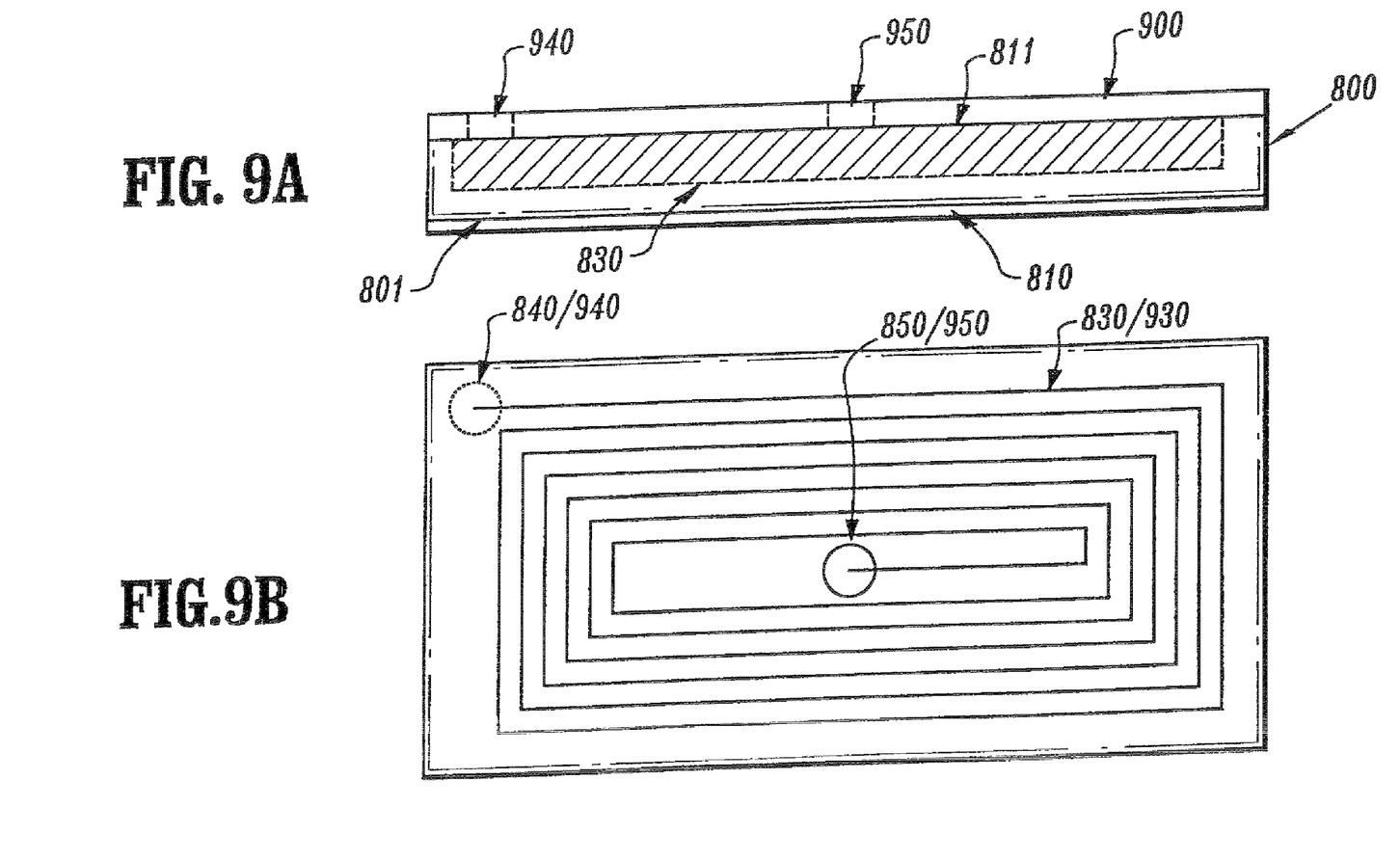
FIGS. 9A and 9B show respective cross-sectional and top views of a continuous trench structure of a second silicon substrate fastened to the first silicon substrate of FIG. 8, according to an embodiment of the present invention.
Figure 10:
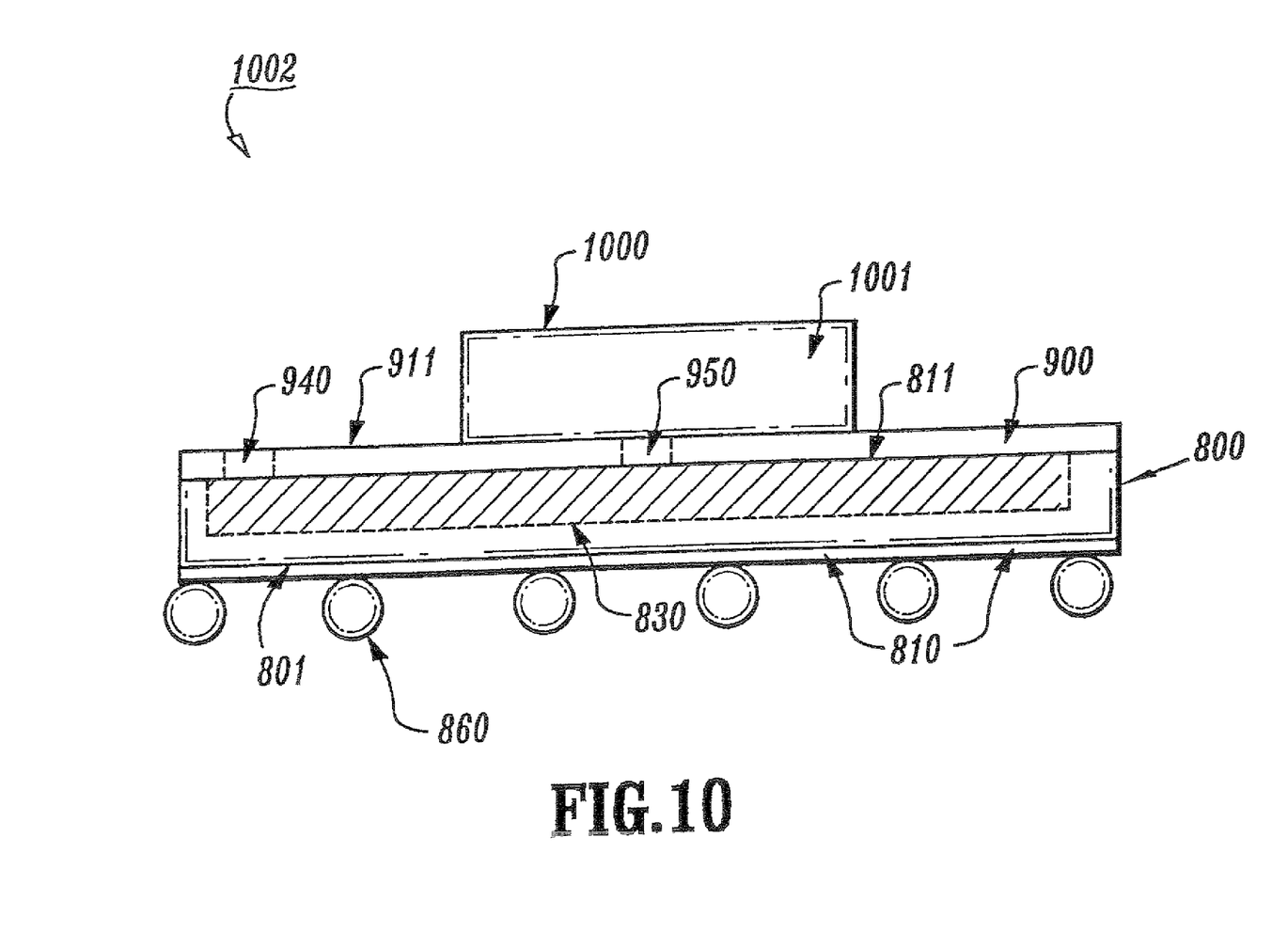
FIG. 10 shows the silicon substrates of FIGS. 8 and 9 including an active cooling apparatus mounted thereto, according to an embodiment of the present invention.

The method and structure for integrating an active cooling system on the backside of an integrated circuit chip is illustrated with respect to FIGS. 8-10. As shown in FIG. 8, on a processed silicon wafer 800, front side circuits 801 are passivated with an encapsulation layer 810. The backside 811 of the substrate 800 is coated with a mask layer or photoresist 820. After the photoresist 820 is patterned and developed, a continuous trench structure 830 is etched into the backside 811 of silicon substrate 800 by wet or dry methods, using, for example chemical or plasma etching. A coolant outlet 840 and a coolant inlet 850 are positioned to allow coolant to respectively exit and enter air the continuous trench structure 830.

Referring to FIGS. 9A and 9B, a second silicon substrate or plate glass substrate 900 is coated with a photoresist (not shown) and patterned with a mirror image of the trench structure 830 of the first silicon substrate 800. The pattern 930 on the second substrate 900 is then constructed with an inlet via 950 and an outlet via 940 using lithographic methods known in the art, such as electron beam lithography. The inlet via 950 and the outlet via 940 correspond to the coolant inlet 850 and the coolant outlet 840, respectively.

The two substrates 800, 900 are fastened together using thermal bonding, anodic bonding techniques, and/or metallurgical soldering methods, Referring to FIGS. 9 and 10, the complete structure consists of the front side circuits 801, and the backside trench structure 830, 930. A micro-pump or a micro-fan 1000, including a pump inlet 1001, is constructed on the backside 911 of the second substrate 900. Gas or liquid coolant from a reservoir 1002 enters the pump inlet 1001 and travels through coolant inlets 850, 950, through the continuous trench structure 830, 930 and through the coolant outlets 840, 940 back to the reservoir 1002. C4 bumps 860 are used to connect the substrate 800 to the package. Efficient heat transfer can be achieved by controlling the temperature of the coolant, the speed at which the coolant is delivered, and the geometry of the micro-plumbing from the micro-pump or micro-fan 1000 to the substrates 800, 900.

The on-chip cooling system of the present invention can be used, with or without an external heat sink, in many existing packages. It is especially suitable for small-size, low-cost, and high-performance packages such as die products, chip-on-board packages, double-sided adhesive flip-chip packages, and multi-chip stacked packages.

In sum, thermal trenches are constructed from the backside of a wafer to improve efficiency of heat transfer from a front-side to the backside of an integrated-circuit chip. In addition, the fabrication of deep trenches from the backside of the wafer allows for increases in the depth and number of trenches, and provides a means to attach passive and active cooling devices directly to the backside of a wafer.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention, All such changes and modifications are intended to be included within the scope of the invention as defined by the appended claims.

What is claimed is:

1. A cooling system for a semiconductor device, comprising:
   an active cooling apparatus positioned on a backside of a first semiconductor substrate;
   a first continuous trench formed in the backside of the first semiconductor substrate; and
   at least one opening in the first continuous trench for allowing coolant supplied from the active cooling apparatus to one of exit and enter the first continuous trench.

2. The cooling system as recited in claim 1, wherein the active cooling apparatus is one of a thermal electric cooling component, a micro-fan device and a micropump.

3. The cooling system as recited in claim 1, wherein the active cooling apparatus is one of directly fabricated on the backside of the first semiconductor substrate and separately built and mounted on the backside of the first semiconductor substrate.

4. The cooling system as recited in claim 1, further comprising:
   a second semiconductor substrate including a second continuous trench, wherein the second semiconductor substrate is fastened to the first semiconductor substrate at a position between the backside of the first semiconductor substrate and the active cooling apparatus, whereby the active cooling apparatus rests on the second semiconductor substrate.

5. The cooling system as recited in claim 4, wherein the second continuous trench is a mirror image of the first continuous trench of the first substrate.

6. The cooling system as recited in claim 4, wherein the second semiconductor substrate is fastened to the first semiconductor substrate by one of anodic bonding and metallurgical soldering.

7. The cooling system as recited in claim 4, wherein the second semiconductor substrate includes at least one opening in the second continuous trench for allowing the coolant supplied from the active cooling apparatus to one of exit and enter the second continuous trench.

8. The cooling system as recited in claim 1, wherein the first continuous trench is formed in the horizontal direction.

9. The cooling system as recited in claim 1, wherein the first semiconductor substrate is one of a complimentary metal oxide semiconductor wafer and a silicon-on-insulator wafer.

10. The cooling system as recited in claim 4, wherein the second semiconductor substrate is one of a silicon substrate and a plate-glass substrate.

11. The cooling system as recited in claim 1, wherein the first continuous trench is formed in an integrated-circuit chip of the first semiconductor substrate.

12. A cooling system for a semiconductor substrate, comprising:

a plurality of trenches formed from a backside of the semiconductor substate;

thermally conductive material deposited in the plurality of trenches; and an active cooling apparatus on the backside of the semiconductor substrate, wherein the active cooling apparatus is connected to a continuous trench formed in the backside of the semiconductor substrate, and to at least one opening in the continuous trench for allowing coolant to enter the continuous trench from the active cooling apparatus.

* * * * *